United States Patent
Rajput et al.

(10) Patent No.: US 9,450,582 B2
(45) Date of Patent: Sep. 20, 2016

(54) PROGRAMMABLE BUFFER SYSTEM

(71) Applicant: FREESCALE SEMICONDUCTOR, INC., Austin, TX (US)

(72) Inventors: Vimal Rajput, Austin, TX (US); Simon J. Gallimore, Austin, TX (US); Bradley G. Hoskins, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/612,774

(22) Filed: Feb. 3, 2015

(65) Prior Publication Data

US 2016/0226492 A1 Aug. 4, 2016

(51) Int. Cl.
| | |
|---|---|
| *H03K 19/173* | (2006.01) |
| *G06F 7/38* | (2006.01) |
| *H03K 19/0175* | (2006.01) |
| *G05B 19/045* | (2006.01) |
| *H03K 19/177* | (2006.01) |
| *G11C 27/04* | (2006.01) |

(52) U.S. Cl.
CPC ..... *H03K 19/017581* (2013.01); *G05B 19/045* (2013.01); *G11C 27/04* (2013.01); *H03K 19/17724* (2013.01)

(58) Field of Classification Search
CPC ............... H03K 19/017581; H03K 19/17724; G05B 19/045; G11C 27/04
USPC ............................................. 326/37, 46, 40
See application file for complete search history.

(56) References Cited

U.S. PATENT DOCUMENTS

| | | |
|---|---|---|
| 5,483,178 A | 1/1996 | Costello et al. |
| 6,327,508 B1 | 12/2001 | Mergard |
| 7,114,093 B2 | 9/2006 | Tardieux et al. |
| 7,464,192 B2 | 12/2008 | Barnett et al. |
| 7,746,101 B1 * | 6/2010 | Young .............. H03K 19/17736 326/38 |

FOREIGN PATENT DOCUMENTS

WO      0135234 A1     5/2001

* cited by examiner

*Primary Examiner* — Daniel D Chang

(57) ABSTRACT

A programmable buffer system includes a plurality of programmable resources. Each of the programmable resources includes, in an unconfigured state, a buffer with multiple entries, an input multiplexer, and an output multiplexer. Configuration information registers specify whether each of the programmable resources is configured as one of a group consisting of: a logic block, a shift register, and a state record, and which of a plurality of timer signals is to be provided to each of the plurality of programmable resources.

19 Claims, 5 Drawing Sheets

PROGRAMMABLE BUFFER SYSTEM

BACKGROUND

1. Field

This disclosure relates generally to buffer systems, and more specifically, to programmable buffer systems.

2. Related Art

Integrated circuits generally, and digital circuits in particular, often have relatively complex input and/or output requirements that sometimes need to be met by additional circuits which add cost and require additional space. Sometimes the buffer circuits are specialized such as for a particular protocol or function. If a particular protocol or function is in common use, then the circuit for that protocol or function can probably be added in a cost effective manner. If not, then the commitment to a particular protocol or function is probably not worth the cost of adding the circuit for that protocol or function. The result then is affected by the degree of popularity of the protocol or function.

The result is that a circuit for a particular protocol or function may not be available and will result in having to add additional circuitry external to the integrated circuit for systems which require that protocol or function to be present. This can add cost and inconvenience that is significant. Thus there is a need to reduce the number of occurrences in which this requirement is present.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a buffer for inputs and outputs is programmable to provide one or more of a logic function, a shift register, and a state machine. This is better understood by reference to the drawings and the following written description.

Figure 1:
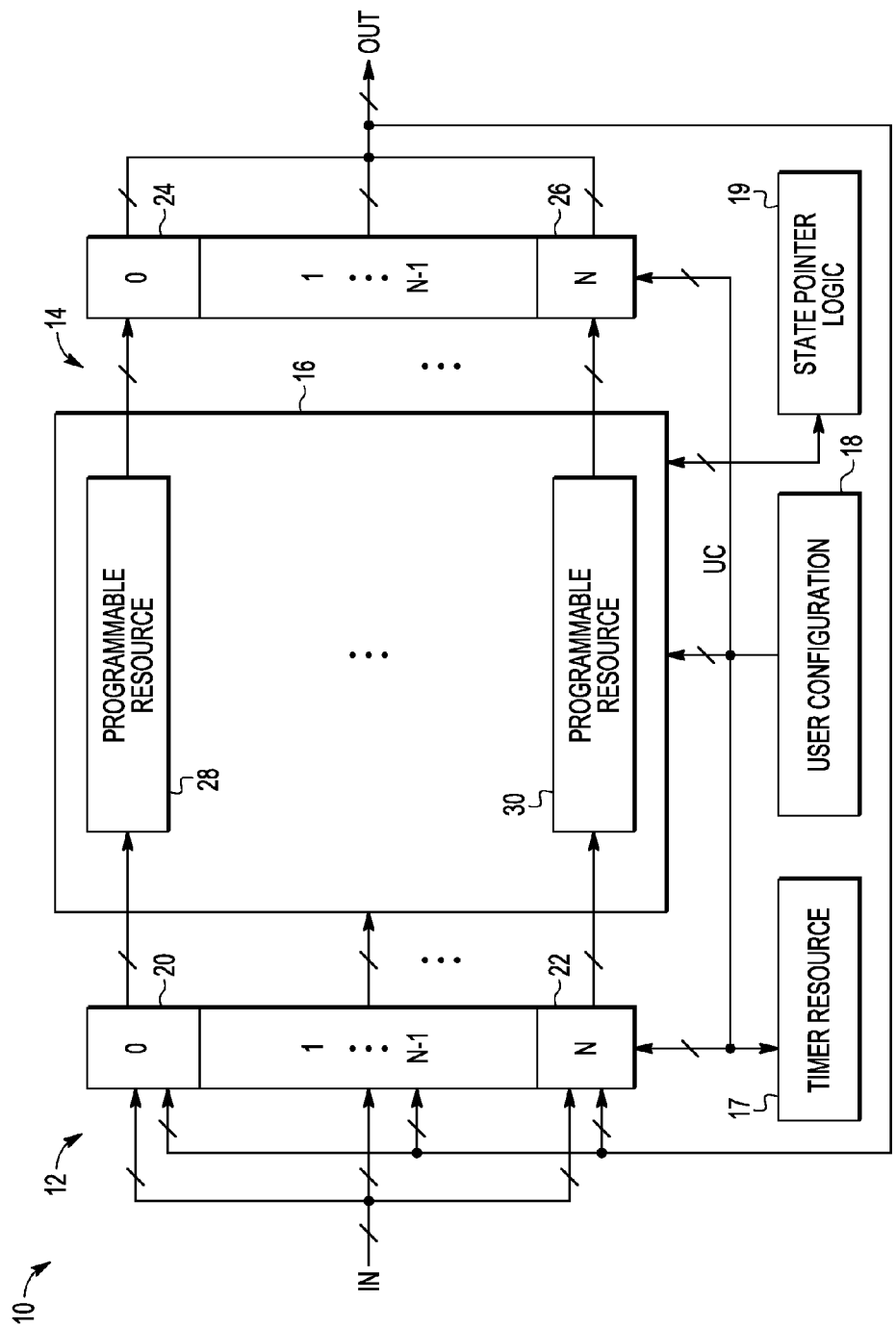
FIG. 1 is a block diagram of a programmable buffer system.

Shown in FIG. 1 is a programmable buffer system 10 having a plurality of multiplexer circuits 12 which function as inputs in this example, a plurality of multiplexer circuits 14 which function as outputs in this example, a plurality of programmable resources 16, a timer resource 17, a user configuration 18, and a state pointer logic 19 coupled to plurality of programmable resources 16. Plurality of multiplexer circuits 12 include N multiplexer circuits 0 through N; examples may be 8 multiplexer circuits designated as 0-7 (N=7), 16 in number designated as 0-15 (N=15), and 32 in number designated as 0-31 (N=31), and so on but not necessarily powers of 2. Multiplexer circuit 0 is shown as multiplexer circuit 20, multiplexer circuit N is shown as multiplexer circuit 22. Plurality of multiplexer circuits 12 may be considered input multiplexer circuits. Plurality of multiplexer circuits 14 include N multiplexer circuits 0 through N examples of which may be 8 in number designated as 0-7, 16 in number designated as 0-15, and 32 in number designated as 0-31, and so on similar to plurality of multiplexer circuits 12. Multiplexer circuit 0 is shown as multiplexer circuit 24, multiplexer circuit N is shown as multiplexer circuit 26. Plurality of multiplexer circuits 12 may be considered output multiplexer circuits. Plurality of programmable resources 16 may include a number of programmable resources equal to that of multiplexer circuits 12.

User configuration 18, which may also be referenced as configuration information registers, specifies a configuration of programmable buffer system 10 with a user configuration signal UC. Timer resource 17 provides timing information with a plurality of timing signals as needed based on a configuration signal UC from user configuration 18. State pointer logic 19 is coupled to plurality of programmable resources 16. Plurality of multiplexer circuits 12 and 14 and plurality of programmable resources 16 receive user configuration signal UC from user configuration 18. Multiplexer circuit 12 receives a multi-bit input IN. Multiplexer circuit 14 provides a multi-bit output OUT. The operation of programmable buffer system 10 is based largely on how it is programmed by user configuration signal UC from user configuration 18. In the form shown in FIG. 1, programmable buffer system 10 is unconfigured. For input multiplexers 12, user configuration 18 provides the information for the selection of the number and location of bits from input and output buses which are sourced by each of the programmable resources 16. Similarly for output multiplexers, user configuration 18 provides the information for the selection of the number and location of the bits on the output buses driven by each programmable resource.

Figure 2:
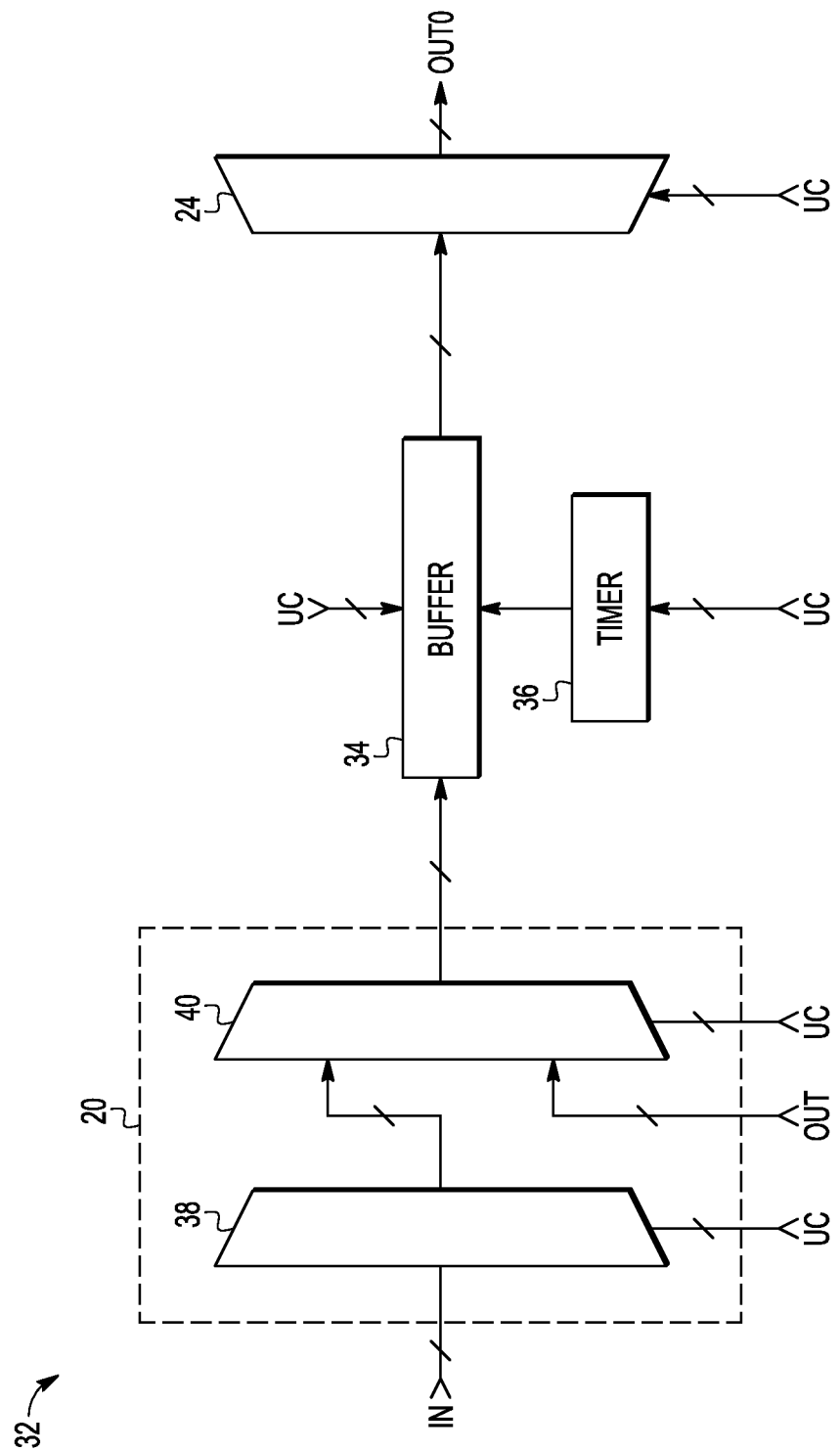
FIG. 2 is a block diagram of a portion of the programmable buffer system of FIG. 1 which has been programmed for use as a shift register.

As shown in FIG. 2, is a shift register 32 using portions of programmable buffer system 10 as programmed by user configuration signal UC. This may be viewed as programmable buffer system 10 configured, at least in part, as shift register 32. Programmable buffer system 10 is programmed to include a shift register operation using programmable resource 28 in this example. Programmable resource 28 includes a buffer 34 as shown in FIG. 2. Multiplexer circuit 20 has a multiplexer 38 and a multiplexer 40. Multiplexer 38 has a multi-bit input that receives input signal IN, a multi-bit selection input that receives user configuration signal UC, and a multi-bit output. Multiplexer 40 has a multi-bit input that receives output signal OUT, another multi-bit input that receives the multi-bit output of multiplexer 38, and a multi-bit output. Buffer 34 from programmable resource 28 has a multi-bit input coupled to the multi-bit output of multiplexer 40 and a multi-bit output coupled to a multi-bit input of multiplexer 24. Multiplexer 24 has a selection input that receives user control signal UC and a multi-bit output as output signal OUT 0 of shift register 32. Basic information contained in user configuration 18 for the shifter mode includes whether buffer 34 will shift in bits from the input multiplexer, which is multiplexer 20 in the case of FIG. 2, or shift out bits to the output multiplexer, which multiplexer 24 in the case of FIG. 2, and the number of bits to shift in or out per timer event. Buffer 34 is used to store the actual data the user wishes, as expressed in user configuration 18, to transmit to the output multiplexer or the actual data the shifter has received from the input multiplexer.

In operation, multiplexer 24 provides what is received on its input as output OUT 0 on a particular output or outputs of multiplexer 24 based on user configuration signal UC. Multiplexer 40 receives output signal OUT which may be output 0 or some other portion of output OUT of programmable buffer system 10. The output of multiplexer 38 is selected from the input IN based on user configuration signal UC. Multiplexer 40 selects between output OUT and the output of multiplexer 38 in providing its output to buffer 34. Timer resource provides a timer signal or signals that correspond to an input/output protocol provided to buffer 34. The fields of buffer 34 store input/output data in a format specified iby the input/output protocol. Timer resource 36 provides timing information as to when buffer will either shift in and store data received from its input or shift out data provided via user configuration to its output. The buffer is able to shift one or more bits on a single timing event output by the timer resource. Thus, user configuration not only provides the information that results in the configuration shown in FIG. 2 but also information that directs which data passes out from the buffer through multiplexer 24. The user configuration can also be used to access data stored in the buffer which has been passed in through multiplexers 38 and 40.

Figure 3:
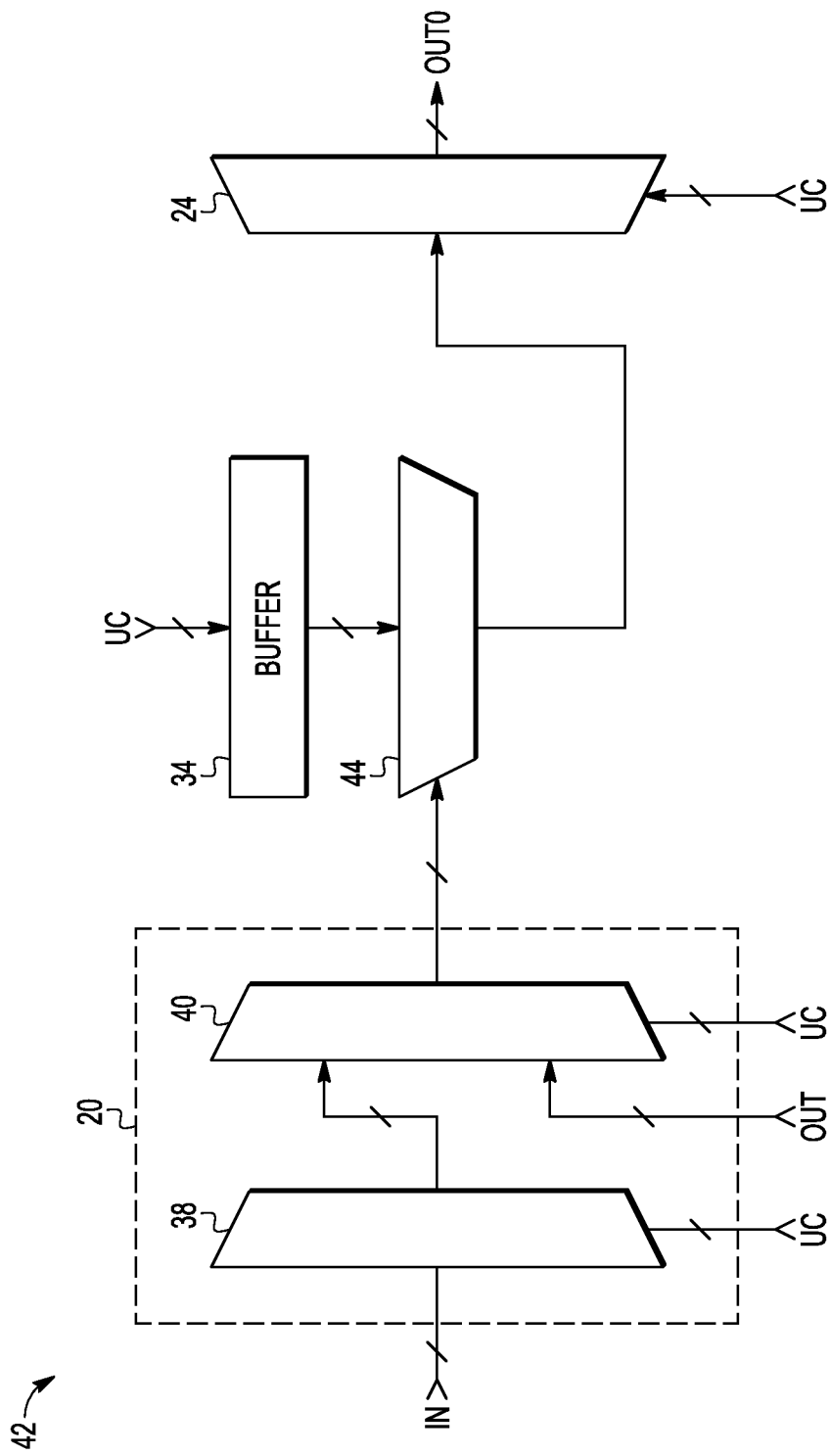
FIG. 3 is a block diagram of a portion of the programmable buffer system of FIG. 1 which has been programmed for use as a logic component.

Shown in FIG. 3 is a programmable logic block circuit 42 using portions of programmable buffer system 10 as programmed by user configuration signal UC. This may be viewed as programmable buffer system 10 configured, at least in part, as programmable logic block 42. Programmable resource 28 includes a multiplexer 44 as shown in FIG. 3. Buffer 34 has fields that store output values for combinations of input values. In this case buffer 34 is loaded from signal UC, with a distinct logic block output value for every combination of possible values driven from multiplexer 40. Multiplexer 44 is then used to select the appropriate output value from buffer 34, for every combination of input value driven out from multiplexer 40. Thus for example, an AND function may be implemented by the user programming one of four locations with a one and the other three with a zero. The three that provide a zero are selected by multiplexer 44 when the input bits from multiplexer 40 have a value of 00, 01, and 10. The buffer location loaded with 1 is selected when the input bits have a value of 11. The particular combination of inputs are selected by multiplexers 38 and 40 as received as input IN or output OUT and then selected by user configuration signal UC. Multiplexer 44 is then used to select the output or outputs from buffer 34 for coupling to the input of multiplexer 24. The AND gate example is a simple example and requires only four outputs from buffer 34 and two inputs applied to the selection input of multiplexer 44. An additional AND gate can be implemented with four more locations of buffer 34 applied to multiplexer 44 and two more selection inputs applied from multiplexer 40 to the selection input of multiplexer 44. Also a very complex logic function can be implemented simply by providing the correct logic state in correspondence to the combination of inputs. A way to view this logic operation is that buffer 34 is used to store an output value to transmit to the output multiplexer for every combination of input value received from input multiplexer which itself may be viewed as a "look-up table."

Figure 4:
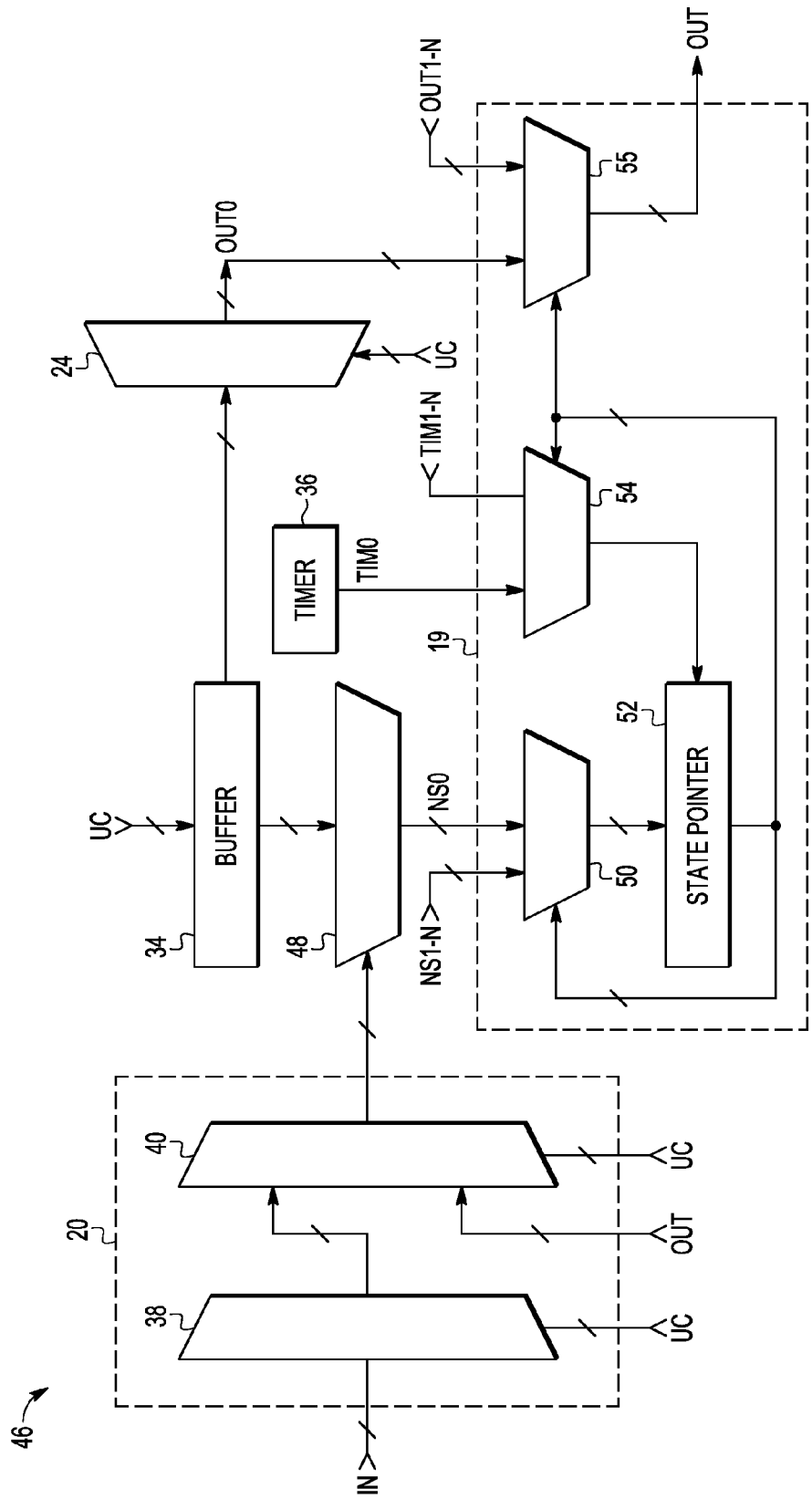
FIG. 4 is a block diagram of a portion of the programmable buffer system of FIG. 1 which has been programmed for use as a state machine.

Shown in FIG. 4 is a configuration 46 implemented to form a state record in part by using a multiplexer 48 from programmable resource 28, state pointer logic 19, and timer 36. This may be viewed as programmable buffer system 10 configured, at least in part, for use as in forming a state machine. Buffer 34 receives user configuration signal UC on its input, provides a multi-bit output that is coupled to a multi-bit input of multiplexer 48, and provides another multi-bit output coupled to a multi-bit input of multiplexer 24. In this configuration, buffer 34 is loaded with state record information which includes a next state value for every combination of input value driven out from multiplexer 40, as well as the multi-bit output data value to be output when programmable resource 28 is the currently active state record. Multiplexer 48 has a multi-bit selector input coupled to the output of multiplexer 40 and an output NS 0, which provides next state information, coupled to a multi-bit input of state pointer logic 19. Multiplexer 24 has a multi-bit output OUT 0, coupled to a multi-bit input of state pointer logic 19. Multiplexer 24 provides the information received on its input, or at least a portion of it, to a selected portion, as selected by user configuration signal UC, of its output OUT 0.

Also shown in FIG. 4 is state pointer logic 19 which includes a next state multiplexer 50, a timer multiplexer 54, an output multiplexer 55 and a state pointer 52. State pointer 52 stores the current state of the state machine and will select the next state, timer and output value from one of the programmable resources (28,30) as the currently active state record. State pointer 52 has a multi-bit output coupled to the selector input of next state multiplexer 50, to the selector input of timer multiplexer 54, and the selector input of output multiplexer 55. Next state multiplexer 50 has a multi-bit input for receiving a multi-bit signal, signal(s) NS 0-N that contain(s) next state information, from one or more of the other programmable resources from plurality of programmable resources 12. Multiplexer 50 has a multi-bit output coupled to an input of state pointer 52. Timer multiplexer 54 has a multi-bit input for receiving a multi-bit signal, signal(s) TIM 0-N that contain(s) timer clock trigger signal(s), from one or more of the other programmable resources from plurality of programmable resources 12. Multiplexer 54 has a multi-bit output coupled to an input of state pointer 52. Output multiplexer 55 has a multi-bit input for receiving a multi-bit signal, signal(s) OUT 0-N that contain(s) output data signal(s), from one or more of the other programmable resources from plurality of programmable resources 12. Multiplexer 55 has a multi-bit output OUT driven out of the programmable buffer system. Multiplexer 55 can functions as an output enable circuit. State pointer 52 uses the selected timer information, TIM 0 or TIM 1-N as selected by multiplexer 54, to determine when the state pointer should be updated with the next state information, NS 0 or NS 1-N as selected by multiplexer 50. After being updated to a new value, state pointer 52 controls the selection inputs of multiplexer 50, multiplexer 54 and multiplexer 55 such that the new active state record is providing the next state, timer, and output value from the state machine. In effect, state pointer register 52 stores an output from state multiplexer 50 when a clock trigger signal is received from timer multiplexer 54.

In this state record mode, buffer 34 is used to store a next state value for every combination of input value received from the input multiplexer, as well as the data to be transmitted to the output multiplexer when the state pointer is selecting this buffer.

Figure 5:
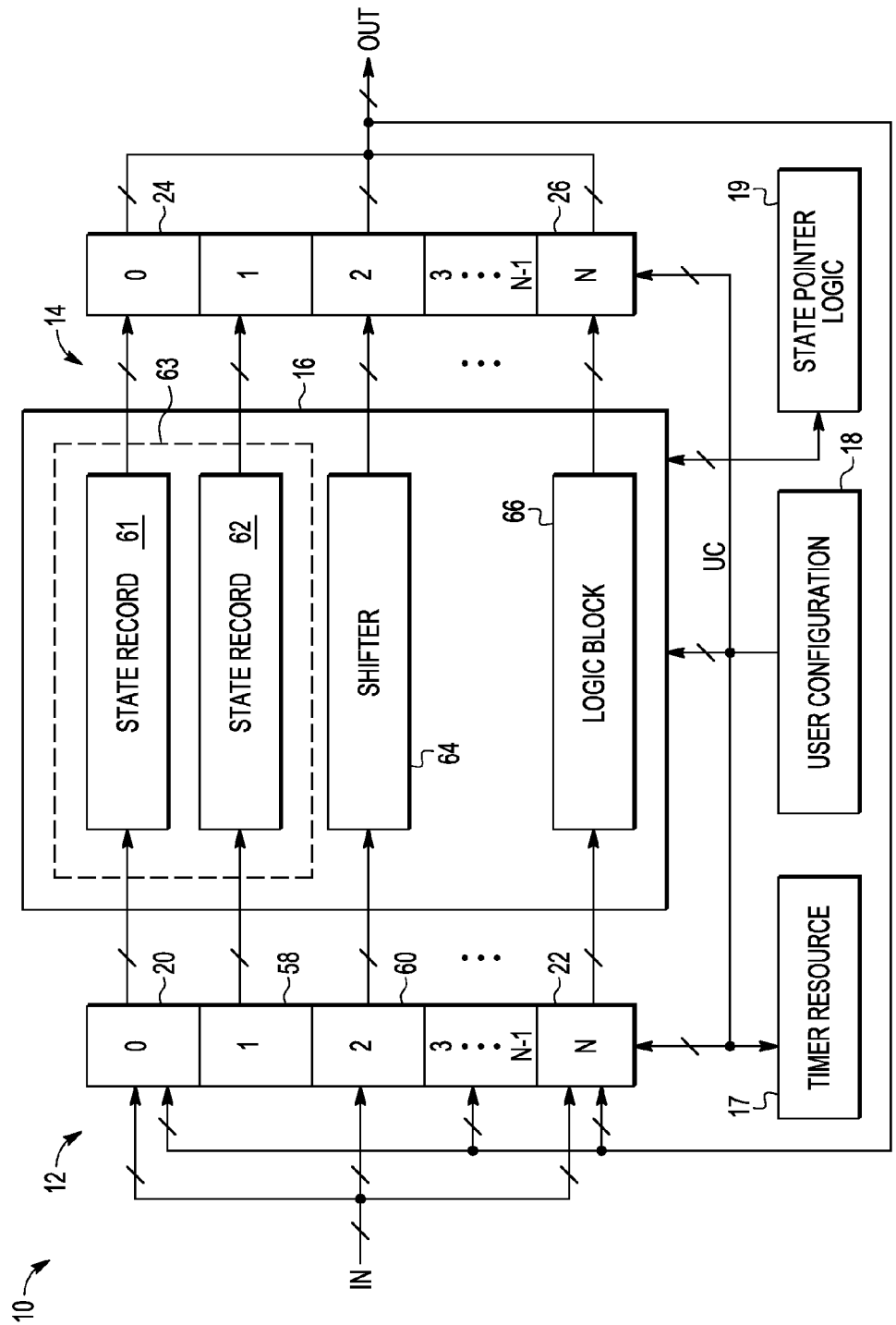
FIG. 5 is a block diagram of the programmable buffer system of FIG. 1 which has been programmed for use as a logic component, a shift register, and a state machine.

Shown in FIG. 5 is programmable buffer system 10 configured to provide a state machine formed using programmable resource 28 to form state record 61, another programmable resource to form a state record 62, another programmable resource to form a shifter 64, and programmable resource 30 to form a logic block 66. Typically, a state machine will require at least two programmable resources such as state records 61 and 62.

Thus it is shown how configurable resources, at the inputs and outputs, can be used to achieve one or more of a programmable logic block, state machine and shifter. This allows for flexibility at the input and output pins and allows for multiple uses of resources. This provides for efficient use of space on the integrated circuit.

By now it should be appreciated that there has been provided a programmable buffer system having a plurality of programmable resources, each of the programmable resources includes, in an unconfigured state, a buffer with multiple entries, an input multiplexer, and an output multiplexer. The programmable buffer system further includes configuration information registers that specify whether each of the programmable resources is configured as one of a group consisting of a logic block, a shift register, and a state record, and which of a plurality of timer signals is to be provided to each of the plurality of programmable resources. The programmable buffer system may further include a timer resource that provides the plurality of timer signals. The programmable buffer system may have a further characterization in which, when one of the plurality of programmable resources is configured as the logic block, a logic multiplexer is configured to receive input from the buffer, a control input from the input multiplexer, and to provide an input to the output multiplexer and an output of the output multiplexer is provided to the input multiplexer. The programmable buffer system may have a further characterization in which, when the one of the plurality of programmable resources is configured as the logic block, the fields of the buffer store output values for combinations of input values. The programmable buffer system may have a further characterization in which at least two of the programmable resources are coupled to one another to implement the one of the group consisting of: the logic block, the shift register, and the state record. The programmable buffer system may have a further characterization in which a first of the programmable resources is coupled to a second of the programmable resources, and each of the first and second programmable resources are configured as a different one of the group consisting of: the logic block, the shift register, and the state record. The programmable buffer system may have a further characterization in which, when one of the plurality of programmable resources is configured as the shift register, one of the plurality of timer signals corresponds to an input/output protocol is provided to the buffer, the input multiplexer is coupled to provide input to the buffer, the buffer is configured to provide an input to the output multiplexer, and an output of the output multiplexer is provided as an input to the input multiplexer. The programmable buffer system may have a further characterization in which, when the one of the plurality of programmable resources is configured as the shift register, fields of the buffer store input/output data in a format specified by input/output protocol. The programmable buffer system may further include state pointer logic, wherein when more than one of the plurality of programmable resources are configured as the state record, each of the more than one of the plurality of programmable resources includes a first state multiplexer (48) and an output enable circuit and, in each of the more than one of the plurality of programmable resources, the buffer provides an output indicating next states of a state pointer for one of the more than one of the plurality of programmable resources to the first state multiplexer and output data to the output enable circuit and the first state multiplexer receives a control input from the input multiplexer and provides a first output indicating one of the next states for the one of the more than one of the plurality of programmable resources to the state pointer logic. The programmable buffer system may have a further characterization in which the state pointer logic includes a second state multiplexer, a state pointer register, and a timer multiplexer, the second state multiplexer receives a second input indicating next states from other of the more than one of the plurality of programmable resources and a control input to select between the next state of the one of the more than one of the plurality of programmable resources and the next states of the other of the more than one of the plurality of programmable resources, and the state pointer register stores an output from the second state multiplexer when a clock trigger signal is received from the timer multiplexer.

Also described is a method of operating a programmable buffer system. The method includes providing configuration information in a configuration register associated with the programmable buffer system for two or more sets of programmable resources, wherein for each of the two or more sets of programmable resources, wherein the configuration information includes an indicator of whether one of the two or more sets of programmable resources is to be configured as a logic block, a state record, or a shift register and which of a plurality of timer signals to use for the one of the two or more sets of programmable resources, wherein, before any of the configuration information is used to configure the one of two or more sets of programmable resources, each of the two or more sets of programmable resources includes a buffer, an input multiplexer, and an output multiplexer. The method may further include. when the one of the two or more sets of programmable resources is configured as the logic block, configuring a logic multiplexer to receive an input from the buffer and a control input from the input multiplexer and to provide an input to the output multiplexer and providing an output of the output multiplexer to the input multiplexer. The method may further include, when the one of the two or more sets of programmable resources is configured as the logic block, storing output values for combinations of input values in entries of the buffer. The method may further include, when the one of the two or more sets of programmable resources is configured as the shift register, providing one of the plurality of timer signals corresponding to an input/output protocol to the buffer, coupling the input multiplexer to provide input to the buffer, coupling the buffer to provide an input to the output multiplexer, and providing an output of the output multiplexer as an input to the input multiplexer. The method may further include, when more than the one of the two or more sets of programmable resources are configured as the shift register, entries of the buffer store input/output data in a format specified by input/output protocol. The method may further include, when more than one of the two or more sets of programmable resources are configured as the state record, each of the more than the one of the two or more sets of programmable resources includes a first state multiplexer and an output enable circuit and, in each of the more than one of the two or more sets of programmable resources configured as the state record, configuring the buffer to provide an output indicating next states of a state pointer to the first state multiplexer and output data to the output enable circuit, and configuring the first state multiplexer to receive a control input from the input multiplexer and provide a first output indicating one of the next states of a corresponding one of the more than one of the two or more sets of programmable resources configured as the state record to state pointer logic. The method may have a further characterization by which the state pointer logic includes a second multiplexer, a state pointer register, and a timer multiplexer and the method further includes receiving in the second state multiplexer a second input indicating next states from other of the two or more sets of programmable resources and a control input to select between the next state of the corresponding one of the two or more sets of programmable resources and the next states of the other of the two or more sets of programmable resources and storing in the state pointer register an output from the second state multiplexer when a clock trigger signal is received from the timer multiplexer.

Described also is a programmable buffer system that includes, in an unconfigured state, a plurality of programmable resources, a plurality of input multiplexers coupled to the plurality of programmable resources, and a plurality of output multiplexers coupled to the plurality of programmable resources. The programmable buffer system further includes a user configuration register including information to configure the plurality of programmable resources as one or more logic blocks, one or more state records, one or more shift registers, or a combination of two or more of a group consisting of a logic block, a state record, and a shift register. The programmable buffer system may have a further characterization in which the user configuration register further includes information that specifies which of a plurality of timer signals is to be provided to each of the plurality of programmable resources. The programmable buffer system may further include a timer resource that provides the plurality of timer signals.

Although the invention is described herein with reference to specific embodiments, various modifications and changes can be made without departing from the scope of the present invention as set forth in the claims below. For example, other ways of achieving a state machine, logic, and a shift register using programmable resources than those specifically described may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A programmable buffer system comprising:
   a plurality of programmable resources, each of the programmable resources includes, in an unconfigured state, a buffer with multiple entries, an input multiplexer, and an output multiplexer;
   configuration information registers that specify:
   whether each of the programmable resources is configured as one of a group consisting of: a logic block, a shift register, and a state record, and
   which of a plurality of timer signals is to be provided to each of the plurality of programmable resources.

2. The programmable buffer system of claim 1, further comprising:
   a timer resource that provides the plurality of timer signals.

3. The programmable buffer system of claim 1, wherein when one of the plurality of programmable resources is configured as the logic block:
   a logic multiplexer is configured to receive input from the buffer, a control input from the input multiplexer, and to provide an input to the output multiplexer, and
   an output of the output multiplexer is provided to the input multiplexer.

4. The programmable buffer system of claim 3, wherein, when the one of the plurality of programmable resources is configured as the logic block:
   the fields of the buffer store output values for combinations of input values.

5. The programmable buffer system of claim 1, wherein:
   at least two of the programmable resources are coupled to one another to implement the one of the group consisting of: the logic block, the shift register, and the state record.

6. The programmable buffer system of claim 1, wherein:
   a first of the programmable resources is coupled to a second of the programmable resources, and each of the first and second programmable resources are configured as a different one of the group consisting of: the logic block, the shift register, and the state record.

7. The programmable buffer system of claim 1, wherein, when one of the plurality of programmable resources is configured as the shift register;
   one of the plurality of timer signals corresponds to an input/output protocol is provided to the buffer,
   the input multiplexer is coupled to provide input to the buffer,
   the buffer is configured to provide an input to the output multiplexer, and
   an output of the output multiplexer is provided as an input to the input multiplexer.

8. The programmable buffer system of claim 7, wherein, when the one of the plurality of programmable resources is configured as the shift register;
   fields of the buffer store input/output data in a format specified by input/output protocol.

9. The programmable buffer system of claim 1, further comprising:
   state pointer logic;
   wherein when more than one of the plurality of programmable resources are configured as the state record, each of the more than one of the plurality of programmable resources includes a first state multiplexer and an output multiplexer, and
   in each of the more than one of the plurality of programmable resources:
   the buffer provides an output indicating next states of a state pointer for one of the more than one of the plurality of programmable resources to the first state multiplexer and output data to the output multiplexer, and the first state multiplexer receives a control input from the input multiplexer and provides a first output indicating one of the next states for the one of the more than one of the plurality of programmable resources to the state pointer logic.

10. The programmable buffer system of claim 9 wherein:
the state pointer logic includes a second state multiplexer, a state pointer register, and a timer multiplexer,
the second state multiplexer receives a second input indicating next states from other of the more than one of the plurality of programmable resources and a control input to select between the next state of the one of the more than one of the plurality of programmable resources and the next states of the other of the more than one of the plurality of programmable resources, and
the state pointer register stores an output from the second state multiplexer when a clock trigger signal is received from the timer multiplexer.

11. A method of operating a programmable buffer system comprising:
providing configuration information in a configuration register associated with the programmable buffer system for two or more sets of programmable resources, wherein for each of the two or more sets of programmable resources, the configuration information includes:
an indicator of whether one of the two or more sets of programmable resources is to be configured as a logic block, a state record, or a shift register; and
which of a plurality of timer signals to use for the one of the two or more sets of programmable resources, wherein, before any of the configuration information is used to configure the one of two or more sets of programmable resources, each of the two or more sets of programmable resources includes a buffer, an input multiplexer, and an output multiplexer.

12. The method of claim 11 further comprising:
when the one of the two or more sets of programmable resources is configured as the logic block:
configuring a logic multiplexer to receive an input from the buffer and a control input from the input multiplexer and to provide an input to the output multiplexer, and
providing an output of the output multiplexer to the input multiplexer.

13. The method of claim 12 further comprising:
when the one of the two or more sets of programmable resources is configured as the logic block, storing output values for combinations of input values in entries of the buffer.

14. The method of claim 11, further comprising:
when the one of the two or more sets of programmable resources is configured as the shift register:
providing one of the plurality of timer signals corresponding to an input/output protocol to the buffer,
coupling the input multiplexer to provide input to the buffer,
coupling the buffer to provide an input to the output multiplexer, and
providing an output of the output multiplexer as an input to the input multiplexer.

15. The method of claim 14 further comprising:
when more than the one of the two or more sets of programmable resources are configured as the shift register, entries of the buffer store input/output data in a format specified by input/output protocol.

16. The method of claim 11 further comprising:
when more than one of the two or more sets of programmable resources are configured as the state record, each of the more than the one of the two or more sets of programmable resources includes a first state multiplexer and an output multiplexer, and
in each of the more than one of the two or more sets of programmable resources configured as the state record:
configuring the buffer to provide an output indicating next states of a state pointer to the first state multiplexer and output data to the output multiplexer circuit, and
configuring the first state multiplexer to receive a control input from the input multiplexer and provide a first output indicating one of the next states of a corresponding one of the more than one of the two or more sets of programmable resources configured as the state record to state pointer logic.

17. The method of claim 16, wherein the state pointer logic includes a second multiplexer, a state pointer register, and a timer multiplexer, the method further comprising:
receiving in the second state multiplexer a second input indicating next states from other of the two or more sets of programmable resources and a control input to select between the next state of the corresponding one of the two or more sets of programmable resources and the next states of the other of the two or more sets of programmable resources, and
storing in the state pointer register an output from the second state multiplexer when a clock trigger signal is received from the timer multiplexer.

18. A programmable buffer system comprising:
in an unconfigured state:
a plurality of programmable resources;
a plurality of input multiplexers coupled to the plurality of programmable resources; and
a plurality of output multiplexers coupled to the plurality of programmable resources; and
a user configuration register including information to configure the plurality of programmable resources as one or more logic blocks, one or more state records, one or more shift registers, or a combination of two or more of a group consisting of a logic block, a state record, and a shift register, wherein the user configuration register further includes information that specifies which of a plurality of timer signals is to be provided to each of the plurality of programmable resources.

19. The programmable buffer system of claim 18, further comprising:
a timer resource that provides the plurality of timer signals.

* * * * *